(12) United States Patent
Sugiura et al.

(10) Patent No.: US 8,917,887 B2
(45) Date of Patent: Dec. 23, 2014

(54) SIGNAL PROCESSOR AND SIGNAL PROCESSING METHOD

(75) Inventors: Chikashi Sugiura, Hamura (JP); Takashi Sudo, Fuchu (JP); Yusaku Kikugawa, Ome (JP); Masataka Osada, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 370 days.

(21) Appl. No.: 13/366,552

(22) Filed: Feb. 6, 2012

(65) Prior Publication Data

US 2012/0250892 A1    Oct. 4, 2012

(30) Foreign Application Priority Data

Mar. 31, 2011    (JP) ................ 2011-080367

(51) Int. Cl.
*H03G 3/00* (2006.01)
*H03G 9/02* (2006.01)
*H03G 5/16* (2006.01)

(52) U.S. Cl.
CPC ............ *H03G 9/025* (2013.01); *H03G 5/165* (2013.01)
USPC ............................ 381/107; 381/104; 381/57

(58) Field of Classification Search
CPC ........... H04R 29/00; H03G 3/20; H03G 7/00; H03G 3/00
USPC ..................... 381/104–109, 56–57
See application file for complete search history.

(56) References Cited

U.S. PATENT DOCUMENTS 7,916,874 B2     3/2011 Shirakawa et al.
8,571,233 B2 *  10/2013 Kikugawa ............... 381/107
2005/0276425 A1 * 12/2005 Forrester et al. ......... 381/104
2010/0226510 A1 *  9/2010 Kikugawa ............... 381/107
2012/0128178 A1 *  5/2012 Fujii ...................... 381/98
2012/0163629 A1 *  6/2012 Seefeldt .................. 381/104

FOREIGN PATENT DOCUMENTS

| JP | H03-074914 | 3/1991 |
| JP | H05-029861 | 2/1993 |
| JP | 2002-151975 | 5/2002 |
| JP | 2006-145818 | 6/2006 |
| JP | 2007-243709 | 9/2007 |
| JP | 4251769 | 1/2009 |
| JP | 2010-212887 | 9/2010 |
| JP | 2010-233059 | 10/2010 |
| JP | 2010-252004 | 11/2010 |

OTHER PUBLICATIONS

Japanese Office Action for Japanese Application No. 2011-080367, mailed Jun. 5, 2012 in 3 pages.

* cited by examiner

*Primary Examiner* — Disler Paul
(74) *Attorney, Agent, or Firm* — Knobbe, Martens, Olson & Bear LLP

(57) ABSTRACT

According to one embodiment, a signal processor includes a band divider, a first correction module, a determiner, an adjuster, and a second correction module. The band divider calculates an amplitude indicating sound pressure from an acoustic signal for each frequency range. The first correction module corrects the amplitude to change the dynamic range of the amplitude to a target range. The determiner determines whether the maximum amplitude of amplitudes corrected by the first correction module is equal to or larger than a threshold. The adjuster adjusts first and second coefficients based on the first condition if the maximum amplitude is equal to or larger than the threshold. The second correction module adds a value obtained by multiplying the acoustic signal by the first coefficient to a value obtained by multiplying the correction amount of the amplitude by the second coefficient, and outputs a resulting value as an output signal.

6 Claims, 8 Drawing Sheets

US 8,917,887 B2

SIGNAL PROCESSOR AND SIGNAL PROCESSING METHOD

CROSS-REFERENCE TO RELATED APPLICATIONS

This application is based upon and claims the benefit of priority from Japanese Patent Application No. 2011-080367, filed Mar. 31, 2011, the entire contents of which are incorporated herein by reference.

FIELD

An embodiment described herein relates generally to a signal processor and a signal processing method.

BACKGROUND

There has been proposed technology to provide a desired listening environment by changing characteristics of acoustic signals by using a digital signal processor (DSP) and the like. In such technology, the output waveform may be clipped (digital clipping) when, for example, the sound pressure level of an acoustic signal is changed. The clipping causes noise in acoustic output. Accordingly, technology has been proposed to suppress the clipping noise. For example, the input gain is reduced by a predetermined amount while clipping occurs to suppress the occurrence of clipping.

In the conventional technology, a volume of an output signal is lowered because only the input gain is reduced during the occurrence of the clipping.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

In general, according to one embodiment, a signal processor comprises a band divider, a first correction module, a determiner, an adjuster, and a second correction module. The band divider is configured to calculate an amplitude indicating sound pressure from an acoustic signal for each frequency range. The first correction module is configured to correct the amplitude for each frequency range to change a dynamic range of the amplitude to a target dynamic range. The determiner is configured to determine whether the maximum amplitude of amplitudes corrected by the first correction module is equal to or larger than a predetermined threshold. The adjuster is configured to adjust a first coefficient and a second coefficient, if the determiner determines that the maximum amplitude is equal to or larger than the threshold, based on a first condition that a sum of a value obtained by multiplying an amplitude of the maximum amplitude before being corrected by the first coefficient and a value obtained by multiplying a correction amount by which the amplitude is corrected to the maximum amplitude by the second coefficient is lower than the threshold. The second correction module is configured to add a value obtained by multiplying the acoustic signal by the first coefficient to a value obtained by multiplying the correction amount of the amplitude by the second coefficient, and output a resulting value as an output signal.

Figure 1:
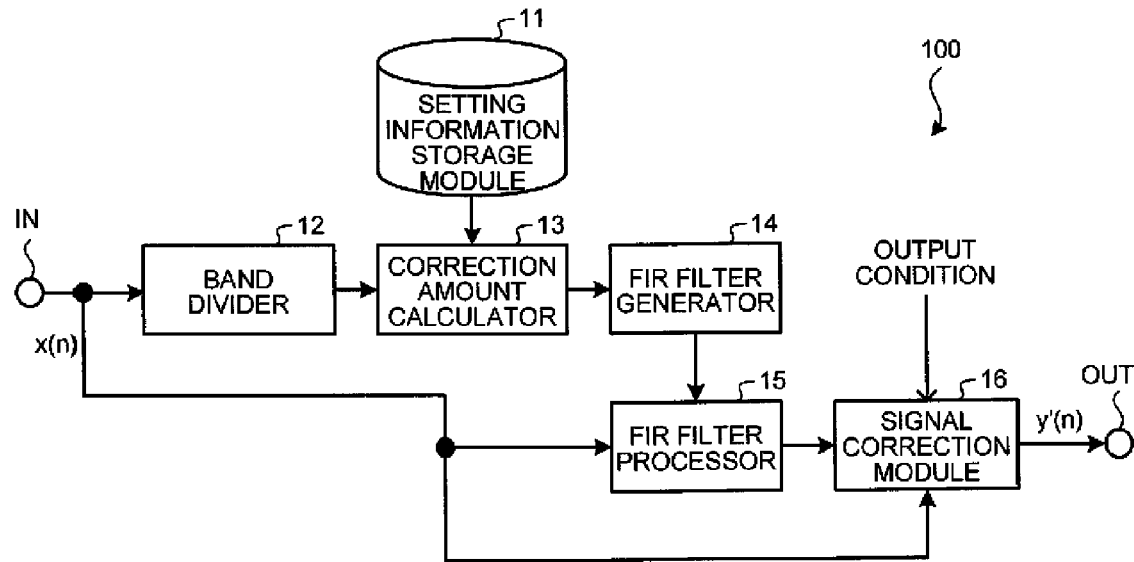
FIG. 1 is an exemplary schematic diagram of a structure of a signal processor according to an embodiment.

FIG. 1 schematically illustrates a structure of a signal processor 100 according to an embodiment. As illustrated in FIG. 1, the signal processor 100 comprises a setting information storage module 11, a band divider 12, a correction amount calculator 13, a finite impulse response (FIR) filter generator 14, an FIR filter processor 15, and a signal correction module 16. The signal processor 100 receives an acoustic signal sent from an external device through an input terminal IN, performs predetermined signal processing on the acoustic signal, and outputs the processed acoustic signal to an external device through an output terminal OUT. The acoustic signal is formed of frames of pulse code modulation (PCM) data or the like.

The setting information storage module 11 preliminarily stores therein parameters as setting information. The parameters are used in changing a dynamic range of sound pressure of an acoustic signal received through the input terminal IN to a certain target dynamic range. The sound pressure of the acoustic signal received through the input terminal IN is, hereinafter, referred to as input sound pressure. The acoustic signal received through the input terminal IN is, hereinafter, referred to as an input signal x(n). The setting information stored in the setting information storage module 11 is described below with reference to FIG. 2.

Figure 2:
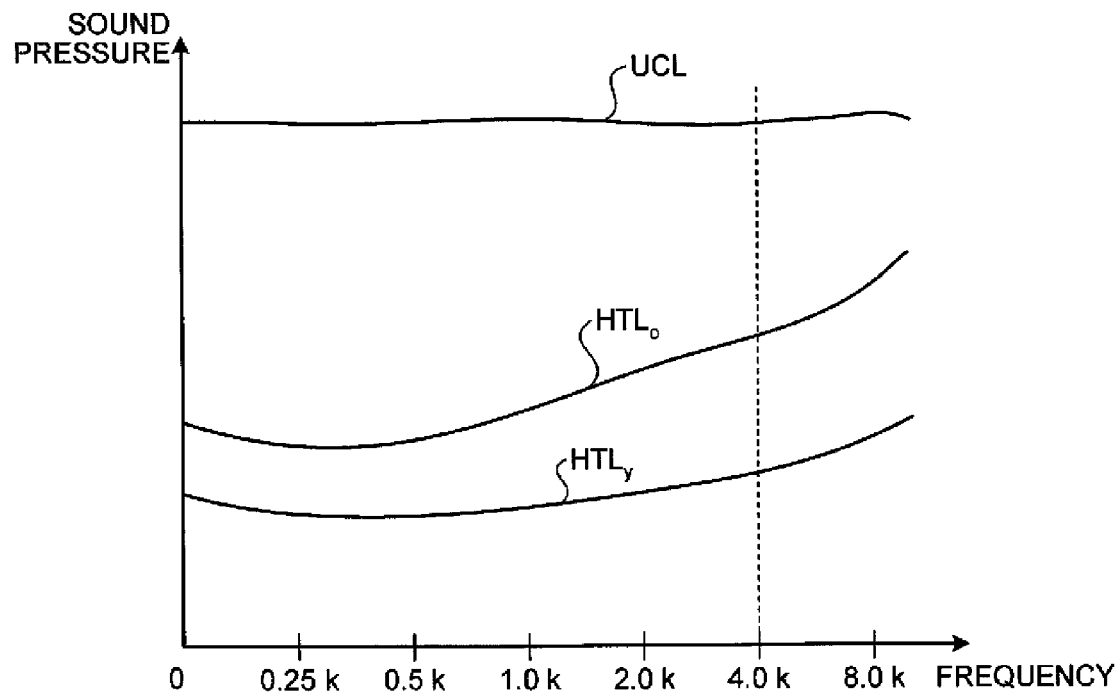
FIG. 2 is an exemplary graph of a relationship between a user's age group and a hearing threshold (HTL) in the embodiment.

It is known that users who are listeners in different age groups have different hearing thresholds (HTLs). The HTL represents a sound pressure level below which a listener's ear is unable to detect any sound. For example, elderly persons generally hardly hear a small sound compared to users in the other age groups because of their reduction in hearing. FIG. 2 is a graph illustrating a relationship between a user's age group and the HTL. In FIG. 2, the horizontal axis represents a frequency while the vertical axis represents a sound pressure level (SPL). The $HTL_o$ represents the typical HDL of elderly persons while the $HTL_y$ represents the typical HDL of users in different age groups from those of the elderly persons. The sound pressure at which elderly persons and users in the different age groups feel a sound as a noise is represented as an uncomfortable loudness level (UCL).

As illustrated in FIG. 2, the overall sound pressure level of the $HTL_o$ is higher than the sound pressure level of the $HTL_y$. Particularly, elderly persons hardly hear a small sound (sound pressure level). In addition, the tendency of difficulty in hearing is more significant in higher frequencies. For elderly persons, the more difficult to hear, the higher frequency a sound has. As described above, the UCL is the same for both elderly persons and users in the other age groups. Therefore, the dynamic range of sound pressure in which the elderly persons can hear any sound is narrower than that of the users in the other age groups. In order to eliminate the difficulty of the elderly persons, the dynamic range of input sound pressure needs to be changed. For example, the $HTL_y$ in the input sound pressure is changed to the $HTL_o$ so as to fit the dynamic range of input sound pressure of the elderly persons.

The setting information storage module 11 preliminarily stores therein the $HTL_y$, the $HTL_o$, and the UCL, for example, as setting information. In the embodiment, the HTL is classified based on user's age groups, i.e., the $HTL_y$ and the $HTL_o$. However, the HTL may be classified based on normal listeners and hearing-impaired persons, for example.

Referring back to FIG. 1, the band divider 12 divides an acoustic signal received through the input terminal IN on a frame-to-frame basis, applies a window function, such as a hamming window, on the divided acoustic signal, and performs fast Fourier transform (FFT) on the resulting signal to calculate a power spectrum. The band divider 12 calculates input sound pressure P. Specifically, the band divider 12 calculates the sum of power for each frequency component of the power spectrum for each frequency range, and derives the logarithmic value of the calculated sum as the input sound pressure P by using formula (1) as follows:

$$P = 10\log_{10}\left(\sum_{i=1}^{N} (H_i)^2\right)\Big/N \quad (1)$$

where i represents the order to identify each frequency range, N represents a maximum value of the number of frequency ranges, and $H_i$ represents the power of the i-th frequency component.

The correction amount calculator 13 calculates a correction amount ΔP of the input sound pressure P in each frequency range found by the band divider 12 by using the setting information stored in the setting information storage module 11, and outputs the correction amount ΔP to the FIR filter generator 14. How to calculate the correction amount ΔP is described below with reference to FIGS. 2 and 3.

As a result of the processing of the band divider 12, input sound pressure is generated for each predetermined frequency range. When the input sound pressure P is calculated in a frequency range of 4 kHz as illustrated in FIG. 2, for example, and the range of the input sound pressure P is corrected according to the sound pressure level of the $HTL_o$, the input sound pressure P is corrected as illustrated in FIG. 3.

Figure 3:
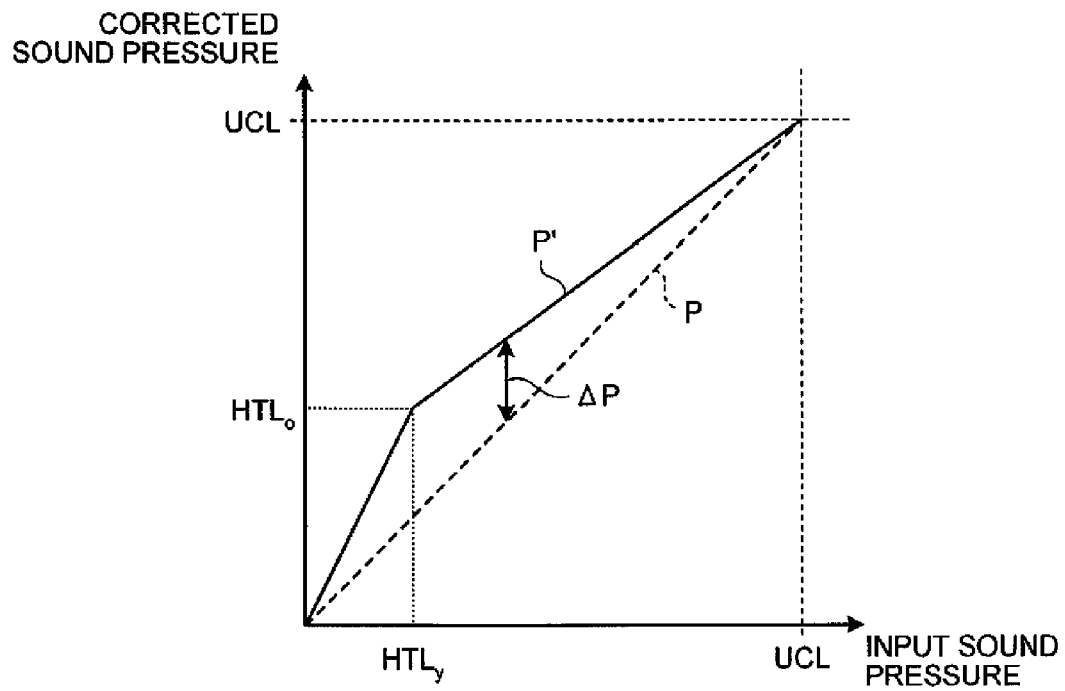
FIG. 3 is an exemplary schematic chart of the state of input sound pressure before and after being corrected in the embodiment.

FIG. 3 illustrates an example of the state of the input sound pressure P before and after being corrected. The horizontal axis represents the sound pressure level of input sound pressure while the vertical axis represents the sound pressure level of input sound pressure after being corrected. The input sound pressure P before being corrected is indicated with the dashed line while the input sound pressure P after being corrected (corrected input sound pressure P') is indicated with the solid line.

In FIG. 3, the $HTL_y$ of the input sound pressure P is corrected to the $HTL_o$ on the corrected input sound pressure P' because the $HTL_o$ is used as the lowest sound pressure level of the sound pressure range for a reference of the correction. The correction amount from the input sound pressure P to the corrected input sound pressure P' is generalized and represented as a difference between the corrected input sound pressure P' and the input sound pressure P, i.e., (P'−P).

The corrected input sound pressure P' can be expressed by formula (2) using a ratio of the $HTL_o$ to the $HTL_y$, and the input sound pressure P. The corrected input sound pressure P' can be expressed by formula (3) using the relationship of the ratio of the $HTL_o$ and the $HTL_y$, and the UCL to the input sound pressure P. Formula (2) is applied when the input sound pressure P satisfies "0≤P<$HTL_y$" while formula (3) is applied when the input sound pressure P satisfies "$HTL_y$≤P".

$$P' = \frac{HTL_o}{HTL_y} \times P \quad (2)$$

$$P' = \frac{UCL - HTL_o}{UCL - HTL_y}(P - HTL_y) + HTL_o \quad (3)$$

The correction amount ΔP is expressed by formulas (4) and (5) by using formulas (1) and (2) where the correction amount ΔP is obtained by subtracting P from P'. Formula (4) is applied when the input sound pressure P satisfies "0≤P<$HTL_y$" while formula (5) is applied when the input sound pressure P satisfies "$HTL_y$≤P".

$$\Delta P = \frac{HTL_o - HTL_y}{HTL_y} \times P \quad (4)$$

$$\Delta P = \frac{(HTL_o - HTL_y)(UCL - P)}{UCL - HTL_y} \quad (5)$$

The correction amount calculator 13 calculates the correction amount ΔP for each frequency range by using formulas (2) to (5) with the setting information ($HTL_y$, $HTL_o$, and UCL) stored in the setting information storage module 11, and the input sound pressure P of each frequency range generated by the band divider 12.

The FIR filter generator 14 performs inverse FFT (inverse transformation) on the correction amount ΔP calculated by the correction amount calculator 13 as a frequency characteristic to calculate a zero phase impulse response waveform, and generates the waveform as an FIR filter coefficient a(m), where "m" is the order to identify each frequency range (m=1 to M, M is a maximum value).

The FIR filter processor 15 performs filtering on the input signal x(n) by using the FIR filter coefficient a(m) calculated by the FIR filter generator 14, and outputs the result to the signal correction module 16. Specifically, to derive an input signal y(n) as a result, the FIR filter processor 15 performs filtering on the input signal x(n) based on formula (6) as follows:

$$y(n) = \sum_{m=1}^{M} a(m) \cdot x(n - m - 1) \quad (6)$$

In this way, the FIR filter processor 15 performs filtering on the input signal x(n) by using formula (6) to generate the input signal y(n). The sound pressure level (dynamic range) of input sound pressure is corrected according to the sound pressure level of the $HTL_o$ of elderly persons so that the input signal y(n) is generated. The FIR filter processor 15 outputs a component d(n) to the signal correction module 16. The component d(n) is the difference between y(n) and x(n), i.e., y(n)−x(n).

The signal correction module 16 determines whether saturation occurs in the sound pressure level of the input signal y(n) after the filtering based on the component d(n) input from the FIR filter processor 15 and the input signal x(n). If it is determined that saturation occurs, the signal correction module 16 corrects the input signal x(n) by using the component d(n) input from the FIR filter processor 15, and outputs an output signal y' that is the result of the correction to an external device through the output terminal OUT.

Specifically, the signal correction module 16 adjusts coefficients α and β of formula (7) according to a predetermined output condition, and adds the result of multiplying the coefficient α by the input signal x(n) to the result of multiplying the coefficient β by the component d (n) so as to find the added value as the output signal y'. The output condition may be stored in a storage medium (not illustrated) or may be input from an external device through an input interface (not illustrated).

$$y'(n) = \alpha \cdot \alpha \cdot x(n) + \beta \cdot d(n) \quad (7)$$

Figure 4:
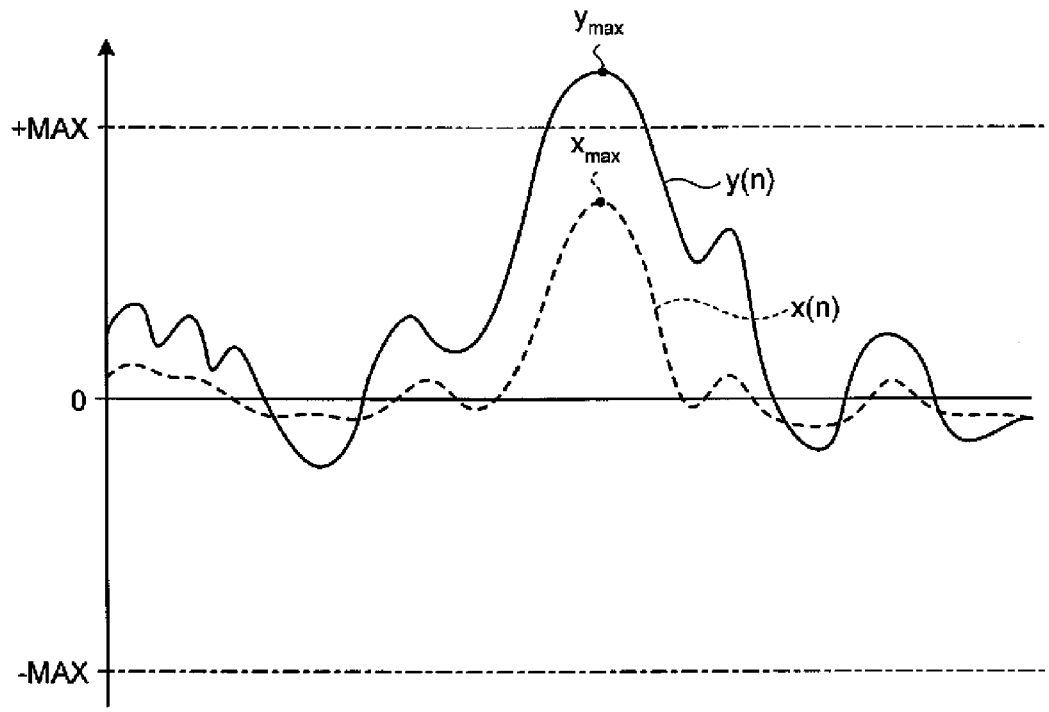
FIG. 4 is an exemplary schematic chart of input sound pressure before and after being filtered in the embodiment.

The correction performed by the signal correction module 16 is described below. FIG. 4 illustrates an example of the input signal x(n) and the input signal y(n) after being filtered by the FIR filter processor 15. In FIG. 4, the horizontal axis represents the frequency while the vertical axis represents the sound pressure level (SPL). The input signal x(n) is indicated with the dashed line while the input signal y(n) after being filtered is indicated with the solid line. On the vertical axis, "+MAX", and "−MAX" represent an upper limit and a lower limit of the sound pressure level, respectively. For example, +MAX=$2^{15}-1$, and −MIN=$-2^{15}$ when expressed by 16-bit integer. Hereinafter, description is made based on |+MAX|=|−MAX|=MAX for simplicity of explanation.

As described above, the range of sound pressure of the input signal x(n) is corrected by filtering performed by the FIR filter processor 15. If saturation occurs in which the corrected sound pressure exceeds the value of the MAX, digital clipping occurs. In the example illustrated in FIG. 4, the maximum value $x_{max}$ of the line x is corrected to the maximum value $y_{max}$ of the line y by being filtered by the FIR filter processor 15, and the y(n) exceeds +MAX around the maximum value $y_{max}$. Thus, digital clipping occurs.

Herein, $x_{max}$ and $y_{max}$ are expressed by formulas (8) and (9), respectively, as follows:

$$x_{max} = |x(k)| \quad (8)$$

$$y_{max} = |y(k)| \quad (9)$$

where "k" is a frequency "n" at which the sound pressure |y(n)| of the input signal y(n) is maximum, and |x(k)| represents the sound pressure of the input signal x(n) at the frequency "k".

In formulas (8) and (9), let the difference between $y_{max}$ and $x_{max}$, i.e., the correction amount from $x_{max}$ to $y_{max}$ be $d_{max} = y_{max} - x_{max}$, as a conditional expression for preventing the occurrence of digital clipping, the following formula (10) can be obtained:

$$\alpha \cdot x_{max} + \beta \cdot d_{max} < \text{MAX} \quad (10)$$

where 0≤α≤1 and 0≤β≤1.

In other words, the occurrence of digital clipping can be suppressed by adopting the coefficients α and β satisfying formula (10). If the coefficient α having a value smaller than one is adopted, the sound pressure of the input signal x(n) becomes small, and thus, the sound pressure of an output signal y' (n) also becomes small. If the coefficient β having a value of smaller than one is adopted, a correction effect (correction amount) of the FIR filter processor 15 lowers. Hereinafter, formula (10) is referred to as a "clipping suppression condition".

If ΔP' is defined as a correction amount of y' (n) with respect to x(n) when the coefficients α and β are changed, from the difference between |y'(n)| and |x(n)|, ΔP' can be expressed by formula (11) as follows:

$$\Delta P' = 20\log_{10}\frac{|y'(n)|}{|x(n)|} \quad (11)$$

$$= 20\log_{10}\frac{\alpha|x(n)| + \beta(|y(n)| - |x(n)|)}{|x(n)|}$$

$$= 20(\log_{10}((\alpha - \beta)|x(n)| + \beta|y(n)|) - \log_{10}|x(n)|)$$

The input signal y(n) is expressed by formula (12). Therefore, formula (11) can be changed to formula (13).

$$y(n) = x(n) \cdot 10^{\frac{\Delta P}{20}} \quad (12)$$

$$\Delta P' = 20\left(\log_{10}\left(\alpha - \beta + \beta \cdot 10^{\frac{\Delta P}{20}}\right) \cdot |x(n)| - \log_{10}|x(n)|\right) \quad (13)$$

$$= 20\left(\log_{10}\left(\alpha + \beta\left(10^{\frac{\Delta P}{20}} - 1\right)\right) + \log_{10}|x(n)| - \log_{10}|x(n)|\right)$$

$$= 20\log_{10}\left(\alpha + \beta\left(10^{\frac{\Delta P}{20}} - 1\right)\right)$$

A minimum correction amount His defined as a minimum amount for correcting input sound pressure so as to be equal to or larger than the $HTL_o$, which is the correction reference, and needs to satisfy formula (14) in relation to ΔP'. The coefficient β is expressed by formula (15) by changing formula (14) where ΔP>0.

$$H \leq \Delta P' = 20\log_{10}\left(\alpha + \beta\left(10^{\frac{\Delta P}{20}} - 1\right)\right) \quad (14)$$

$$\beta \geq \left(10^{\frac{H}{20}} - \alpha\right)/\left(10^{\frac{\Delta P}{20}} - 1\right) \quad (15)$$

Accordingly, at a certain frequency range f, a minimum coefficient β(f) satisfying the minimum correction amount H can be expressed by formula (16) as follows:

$$\beta(f) = \left(10^{\frac{H(f)}{20}} - \alpha\right)/\left(10^{\frac{\Delta P(f)}{20}} - 1\right) \quad (16)$$

It can be understood that the coefficient β satisfying the condition of formula (17) achieves the minimum correction amount H. In formula (17), "fmax" represents a frequency range at which the sound pressure is a maximum value in each frequency range f. In formula (17), the value of β(fmax) is defined as $\beta_{min}$. Hereinafter, formula (17) is referred to as a "correction amount keeping condition".

$$\beta \geq \beta_{min} = \beta(f\text{max}) = \left(10^{\frac{H(f\text{max})}{20}} - \alpha\right)/\left(10^{\frac{\Delta P(f\text{max})}{20}} - 1\right) \quad (17)$$

The signal correction module 16 determines the values of the coefficients α and β according to the output condition by using the clipping suppression condition and the correction amount keeping condition, calculates y' by using formula (7) with the coefficients α and β, and outputs the output signal y' satisfying the output condition to an outside.

The output condition is generally further classified into the following three conditions. A first output condition is a "sound pressure keeping mode" in which the output signal is output while keeping the level of the input sound pressure by setting the value of the coefficient α to "one". The sound pressure keeping mode is further classified into two types of output: "clipping suppression prioritized output" in which suppression of digital clipping is prioritized, and "first correction amount prioritized output" in which keeping the minimum correction amount H is prioritized.

The signal correction module 16, when the clipping suppression prioritized output is instructed in the sound pressure keeping mode, sets the coefficient α of formula (7) to "one", and sets the coefficient β of formula (7) to any one value of the coefficient β satisfying the clipping suppression condition. Any value of the coefficient β can be selected for formula (7). However, if a certain range of the coefficient β satisfies the correction amount keeping condition, a maxim value in the range of the coefficient β is selected. The correction of the input signal x(n) by using the coefficients α and β set in the clipping suppression prioritized mode can suppress the occurrence of digital clipping while the sound pressure of the input signal x(n) is kept. In addition, the use of the maximum value in the range of the coefficient β satisfying the correction amount keeping condition can suppress the correction amount corrected by the FIR filter processor 15 from being lowered.

The signal correction module 16, when the first correction amount prioritized output is instructed in the sound pressure keeping mode, sets the coefficient α of formula (7) to "one", and sets the coefficient β of formula (7) to any one value of the coefficient β satisfying the correction amount keeping condition. Any value of the coefficient β can be selected for formula (7). However, if a certain range of the coefficient β satisfies the clipping suppression condition, a maxim value in the range of the coefficient β is selected. The correction of the input signal x(n) by using the coefficients α and β set in the optimum correction prioritized mode can suppress the correction amount corrected by the FIR filter processor 15 from being lowered. In addition, the use of the maximum value in the range of the coefficient β satisfying the clipping suppression condition can suppress the occurrence of digital clipping.

A second output condition is a "clipping suppression mode" in which the occurrence of digital clipping is suppressed by setting the coefficients α and β satisfying the clipping suppression condition. The clipping suppression mode is further classified into two types of output: "sound pressure prioritized output" in which keeping the input sound pressure is prioritized, and "second correction amount prioritized output" in which keeping the minimum correction amount H is prioritized.

The signal correction module 16, when the sound pressure prioritized output is instructed in the clipping suppression mode, sets the coefficient α of formula (7) to a maximum value of a out of sets of α and β satisfying the clipping suppression condition while the signal correction module 16 sets the coefficient β of formula (7) to any one value of β of the set including the set α. The correction of the input signal x(n) by using the coefficients of α and β set in the sound pressure prioritized output can suppress the occurrence of digital clipping and the input sound pressure from being lowered.

The signal correction module 16, when the second correction amount prioritized output is instructed in the clipping suppression mode, sets the coefficient β of formula (7) to a maximum value of β satisfying the correction amount keeping condition out of sets of α and β satisfying the clipping suppression condition while the signal correction module 16 sets the coefficient α of formula (7) to any one value of a of the set including the set β. If no β satisfying the correction amount keeping condition is present, a maximum value of β satisfying the clipping suppression condition is set to the coefficient β. The correction of the input signal x(n) by using the coefficients α and β set in the second correction amount prioritized output can suppress the occurrence of digital clipping and the correction amount corrected by the FIR filter processor 15 from being lowered.

A third output condition is a "correction amount keeping mode" in which the correction amount corrected by the FIR filter processor 15 is kept. The signal correction module 16, when the correction amount keeping mode is instructed, calculates a range of β ($\beta_{min} \leq \beta$) based on the correction amount keeping condition by reducing the coefficient α step-by-step by a predetermined amount (e.g., by 0.1) from one. Out of the sets of calculated α and β, a maximum value of α and a minimum value of β are set to the coefficients α and β of formula (7), respectively. If no α and β satisfying the clipping suppression condition are present, a set of α and β minimizing the left-hand side of the clipping suppression condition is set to the coefficient α and β of formula (7). The correction of the input signal x(n) by using the coefficients α and β set in the correction amount keeping mode can suppress the occurrence of digital clipping while the correction amount corrected by the FIR filter processor 15 is kept.

Figure 5:
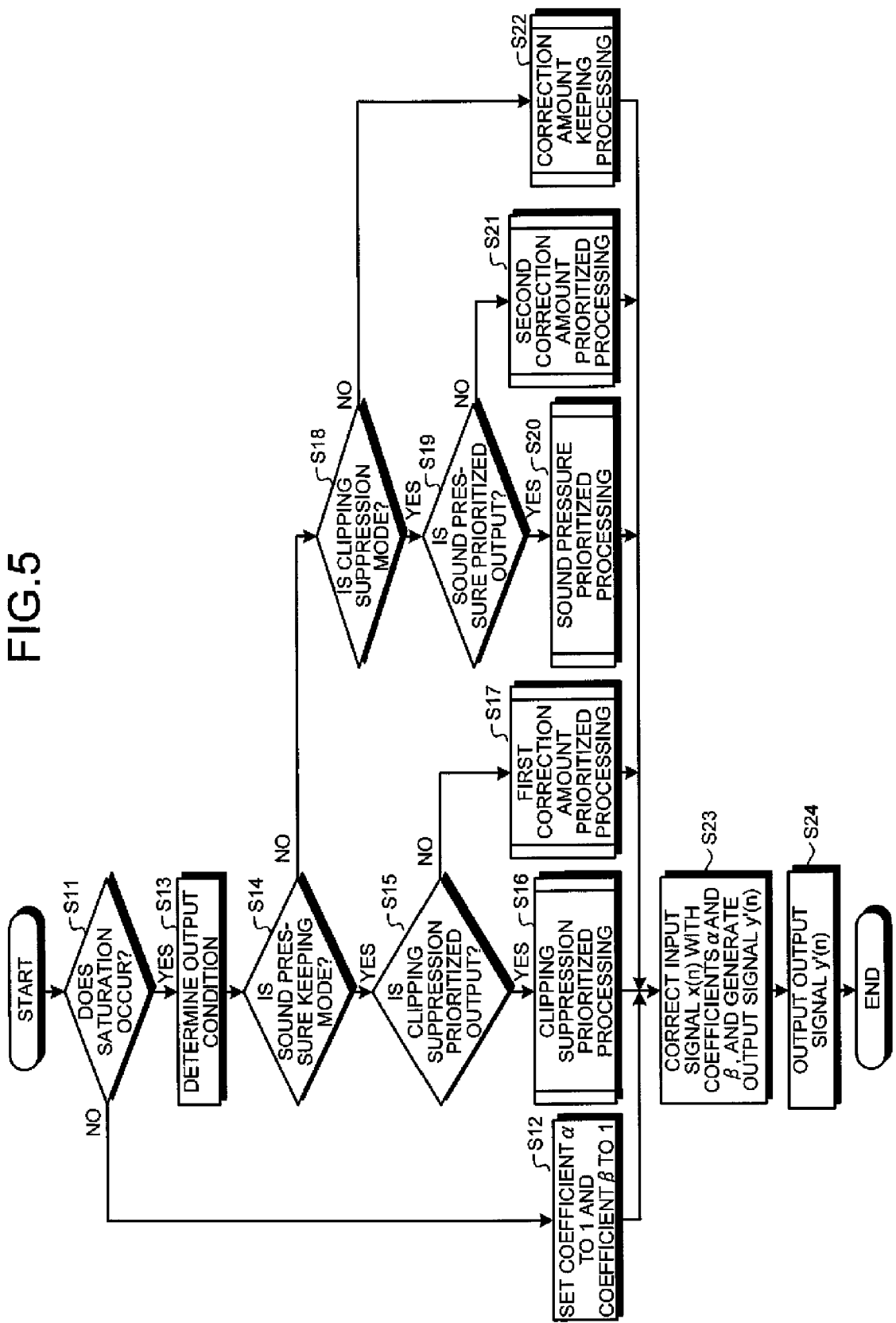
FIG. 5 is an exemplary flowchart of signal correction in the embodiment.

The operation of the signal correction module 16 is described below with reference to FIG. 5. FIG. 5 is a flowchart of signal correction performed by the signal correction module 16.

The signal correction module 16 determines whether saturation occurs in the sound pressure level of the input signal y(n) after being filtered based on the component d(n) input from the FIR filter processor 15 and the input signal x(n) (S11). If it is determined that no saturation occurs (NO at S11), the signal correction module 16 sets the coefficients α and β of formula (7) to "one" (S12), and moves to S23.

On the other hand, if it is determined that saturation occurs (YES at S11), the signal correction module 16 determines the output condition (S13). If the output condition is the "sound pressure keeping mode" (YES at S14), the signal correction module 16 further determines whether either the "clipping suppression prioritized output" or the "first correction amount prioritized output" is instructed (S15).

If it is determined that the "clipping suppression prioritized output" is instructed (YES at S15), the signal correction module 16 performs clipping suppression prioritized processing (S16). The clipping suppression prioritized processing at S16 is described below with reference to FIG. 6.

Figure 6:
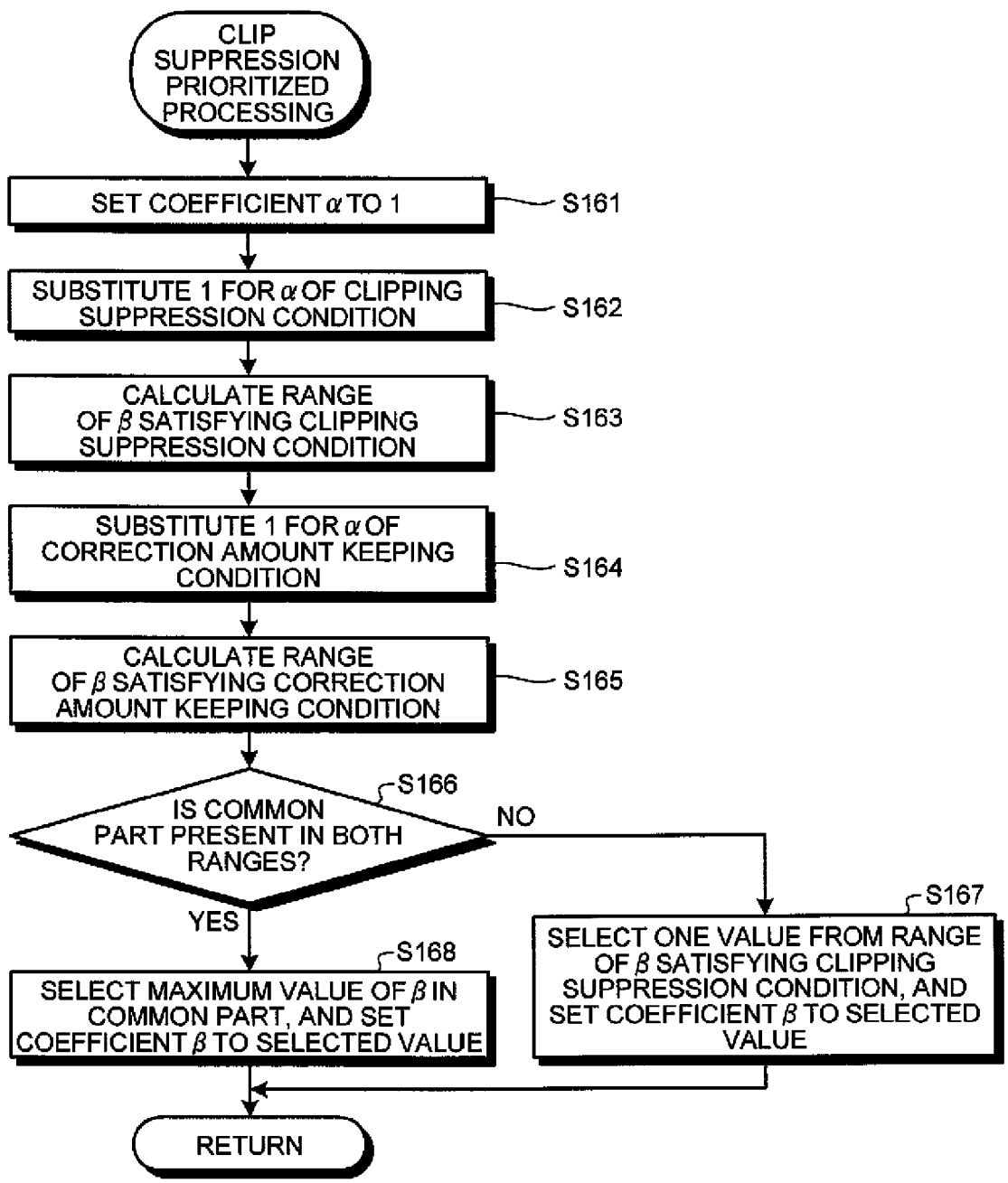
FIG. 6 is an exemplary flowchart of clipping suppression prioritized processing in the embodiment.

FIG. 6 is a flowchart of the clipping suppression prioritized processing. The signal correction module 16 sets the coefficient α of formula (7) to "one" (S161). Then, the signal correction module 16 substitutes "one" for a of the clipping suppression condition (S162), and calculates the range of β satisfying the clipping suppression condition (S163).

Then, the signal correction module 16 substitutes "one" for α of the correction amount keeping condition (S164), and calculates the range of β ($\beta_{min} \leq \beta$) satisfying the correction amount keeping condition (S165). The signal correction module 16 compares the calculation result at S163 with the calculation result at S165, and determines whether a common part in both ranges is present (S166). If it is determined that no common part is present (NO at S166), the signal correction module 16 selects any one value in the range of β calculated at S163, sets the coefficient β of formula (7) to the selected value (S167), and thereafter moves to S23 of FIG. 5.

On the other hand, if it is determined that the common part is present (YES at S166), the signal correction module 16 selects a maximum value of β in the common part, sets the coefficient β of formula (7) to the selected value (S168), and thereafter moves to S23 of FIG. 5.

Referring back to FIG. 5, if it is determined that the "first correction amount prioritized output" is instructed (NO at S15), the signal correction module 16 performs first correction amount prioritized processing (S17). The first correction amount prioritized processing at S17 is described below with reference to FIG. 7.

Figure 7:
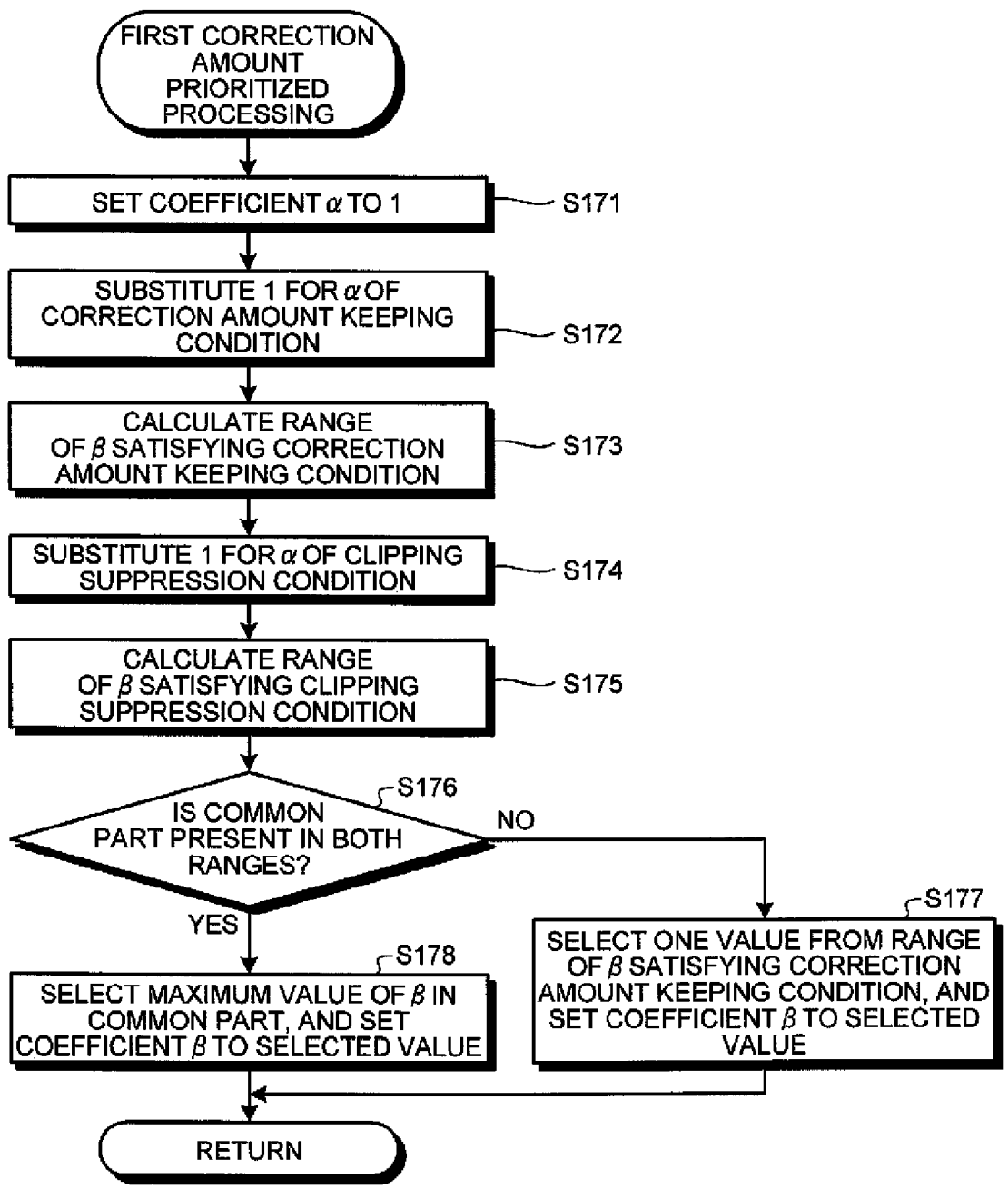
FIG. 7 is an exemplary flowchart of first correction amount prioritized processing in the embodiment.

FIG. 7 is a flowchart of the first correction amount prioritized processing. The signal correction module 16 sets the coefficient α of formula (7) to "one" (S171). Then, the signal correction module 16 substitutes "one" for α of the correction amount keeping condition (S172), and calculates the range of β ($β_{min}≤β$) satisfying the correction amount keeping condition (S173).

Then, the signal correction module 16 substitutes "one" for α of the clipping suppression condition (S174), and calculates the range of β satisfying the clipping suppression condition (S175). The signal correction module 16 compares the calculation result at S173 with the calculation result at S175, and determines whether a common part in both ranges is present (S176). If it is determined that no common part is present (NO at S176), the signal correction module 16 selects any one value in the range of β calculated at S173, sets the coefficient β of formula (7) to the selected value (S177), and thereafter moves to S23 of FIG. 5.

On the other hand, if it is determined that the common part is present (YES at S176), the signal correction module 16 selects a maximum value of β in the common part, sets the coefficient β of formula (7) to the selected value (S178), and thereafter moves to S23 of FIG. 5.

Referring back to FIG. 5, if the output condition is the "clipping suppression mode" (NO at S14 and YES at S18), the signal correction module 16 further determines whether either the "sound pressure prioritized output" or the "second correction amount prioritized output" is instructed (S19). If it is determined that the "sound pressure prioritized output" is instructed (YES at S19), the signal correction module 16 performs sound pressure prioritized processing (S20). The sound pressure prioritized processing at S20 is described below with reference to FIG. 8.

Figure 8:
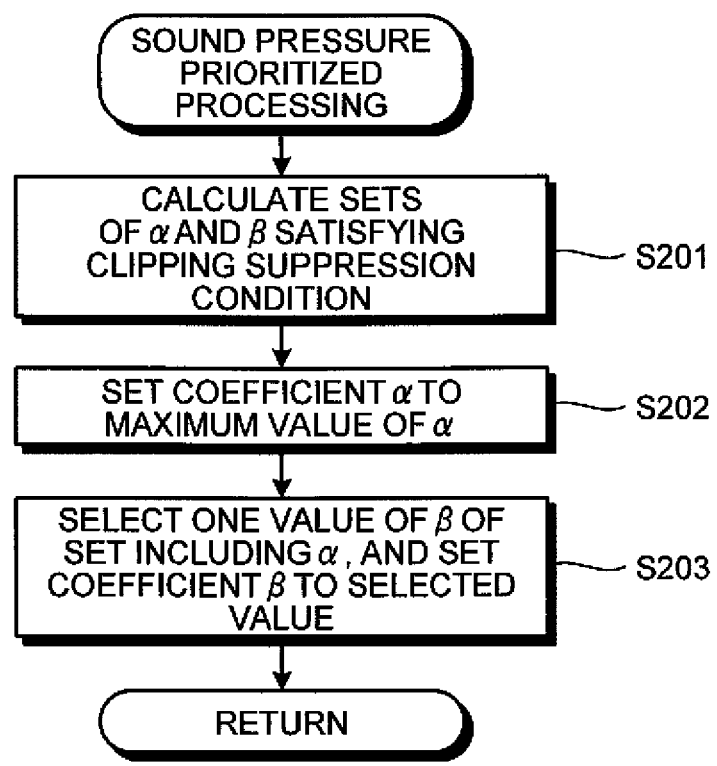
FIG. 8 is an exemplary flowchart illustrating sound pressure prioritized processing in the embodiment.

FIG. 8 is a flowchart of the sound pressure prioritized processing. The signal correction module 16 calculates sets of α and β satisfying the clipping suppression condition (S201). Then, the signal correction module 16 selects a maximum value of α out of the sets calculated at S201, and sets the coefficient α of formula (7) to the selected value (S202). Then, the signal correction module 16 selects one value of β of the set from which a is selected at S202, sets the coefficient β of formula (7) to the selected value (S203), and thereafter moves to S23 of FIG. 5.

Referring back to FIG. 5, if it is determined that the "second correction amount prioritized output" is instructed (NO at S19), the signal correction module 16 performs second correction amount prioritized processing (S21). The second correction amount prioritized processing at S21 is described below with reference to FIG. 9.

Figure 9:
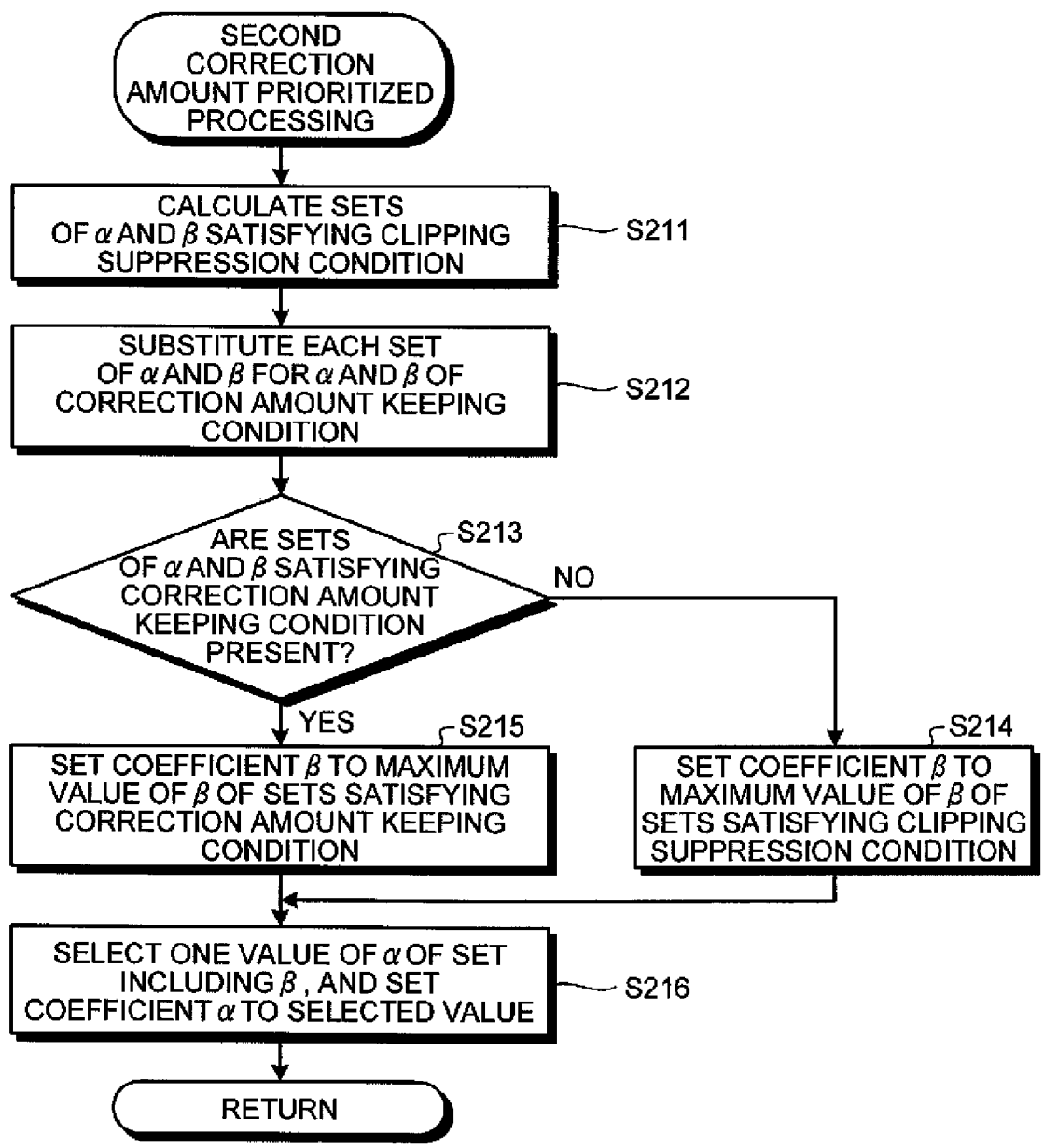
FIG. 9 is an exemplary flowchart of second correction amount prioritized processing in the embodiment.

FIG. 9 is a flowchart of the second correction amount prioritized processing. The signal correction module 16 calculates sets of α and β satisfying the clipping suppression condition (S211). Then, the signal correction module 16 substitutes the values of each set calculated at S211 for α and β of the correction amount keeping condition (S212), and determines whether sets satisfying the correction amount keeping condition are present (S213). If it is determined that no set satisfying the correction amount keeping condition is present (NO at S213), the signal correction module 16 selects a maximum value of β out of the sets calculated at S211, sets the coefficient β of formula (7) to the selected value (S214), and thereafter moves to S216.

On the other hand, if it is determined that the sets satisfying the correction amount keeping condition are present (YES at S213), the signal correction module 16 selects a maximum value of β in the sets satisfying the correction amount keeping condition, sets the coefficient β of formula (7) to the selected value (S215), and thereafter moves to S216.

Then, the signal correction module 16 selects one value of α in the set including β set at S214 or S215, sets the coefficient α of formula (7) to the selected value (S216), and thereafter moves to S23.

Referring back to FIG. 5, if the output condition is the "correction amount keeping mode" (NO at S14 and NO at S18), the signal correction module 16 performs correction amount keeping processing (S22). The correction amount keeping processing at S22 is described below with reference to FIG. 10.

Figure 10:
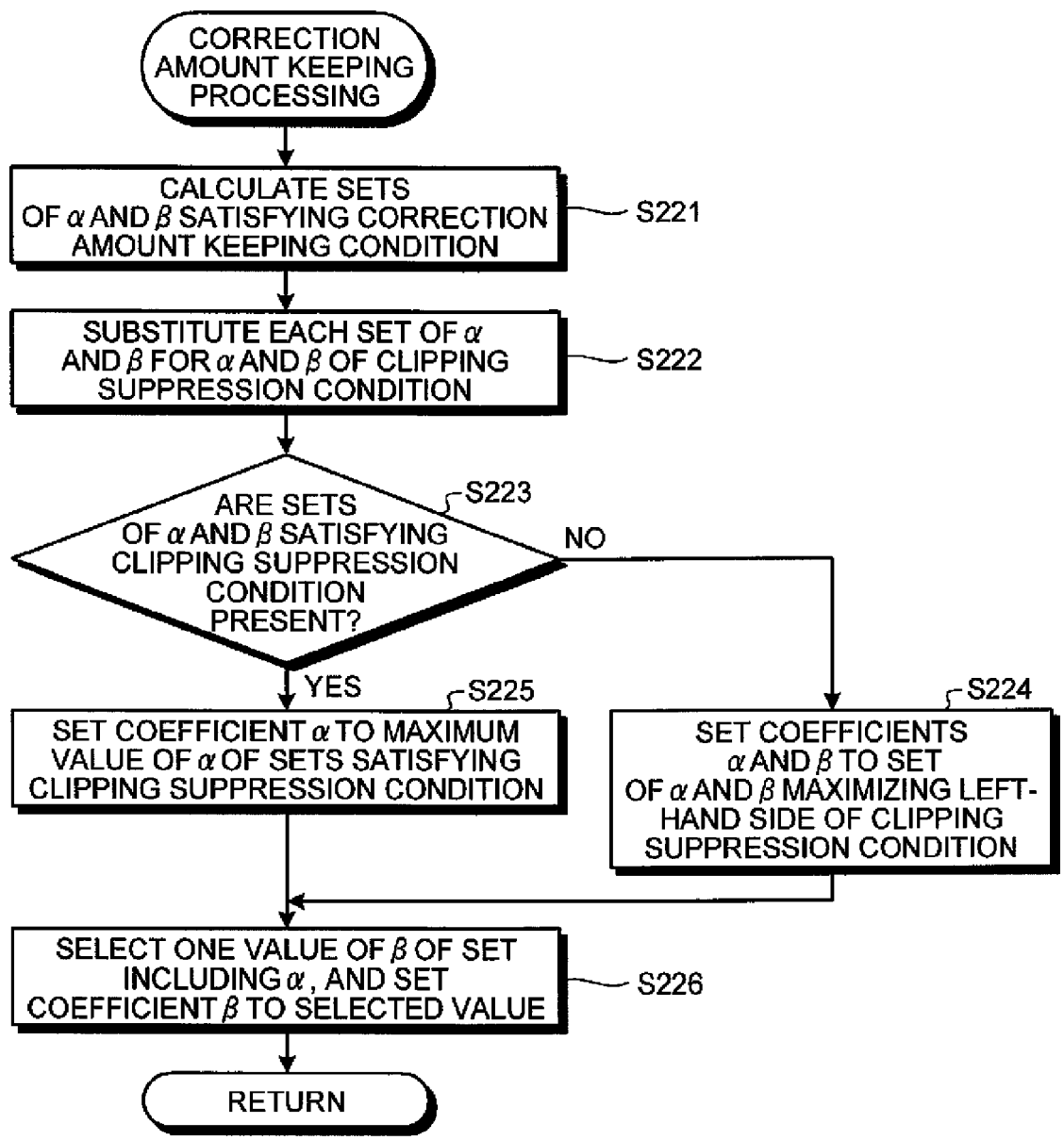
FIG. 10 is an exemplary flowchart of correction amount keeping processing in the embodiment.

FIG. 10 is a flowchart of the correction amount keeping processing. The signal correction module 16 reduces the value of α step-by-step by a predetermined amount from one, and calculates the range of β ($β_{min}≤β$) satisfying the correction amount keeping condition for each value of α (S221). Then, the signal correction module 16 substitutes the values of each set of α and β calculated at S221 to α and β of the clipping suppression condition (S222), and determines whether sets satisfying the clipping suppression condition are present (S223). If it is determined that no set satisfying the clipping suppression condition is present (NO at S223), the signal correction module 16 selects a set of α and β minimizing the left-hand side of the clipping suppression condition, sets the coefficients α and β of formula (7) to the selected values (S224), and thereafter moves to S23 of FIG. 5.

On the other hand, if it is determined that the sets satisfying the clipping suppression condition are present (YES at S223), the signal correction module 16 selects a maximum value of α in the sets satisfying the clipping suppression condition, sets the coefficient α of formula (7) to the selected value (S225). Then, the signal correction module 16 selects one value of β of the set from which α is selected at S225, sets the coefficient β of formula (7) to the selected value (S226), and thereafter moves to S23 of FIG. 5.

Referring back to FIG. 5, the signal correction module 16 corrects the input signal x(n) by using formula (7) in which the coefficients α and β have been set to produce the output signal y' (n) (S23), outputs the output signal y' (n) to the output terminal OUT (S24), and thereafter completes the processing.

As described above, in the embodiment, anyone of the clipping suppression prioritized processing (S16), the first correction amount prioritized processing (S17), the sound pressure prioritized processing (S20), the second correction amount prioritized processing (S21), and the correction amount keeping processing (S22) is performed. Thereafter, the input signal x(n) is corrected by using the coefficients α and β determined by the performed processing. This procedure can suppress the correction amount from being lowered caused by the change of the dynamic range in the FIR filter processor 15 while suppressing the occurrence of digital clipping caused by the change. As a result, the suppression of both occurrence of digital clipping and lowering of a sound volume can be achieved simultaneously.

In addition, the input signal x(n) can be corrected with the output condition that a user who is a listener desires, because in the embodiment, any one of the clipping suppression prioritized processing (S16), the first correction amount prioritized processing (S17), the sound pressure prioritized processing (S20), the second correction amount prioritized processing (S21), and the correction amount keeping processing (S22) is performed. Accordingly, the output signal according to the output condition that the user desires can be output. As a result, user-friendliness can be enhanced.

In the embodiment, the output signal y' (n) is output on a frame-to-frame basis by using formula (7). Accordingly, the discontinuous output of the output signal y' (n) causes output sound to be unnatural. In order to avoid such unnatural sound, the output signal y' (n) may be smoothed in the temporal direction, and thereafter output. This can eliminate unnaturalness in output sound.

Although the input sound pressures P are derived for all the frequency ranges and they are corrected by using the filter coefficients corresponding to the correction amounts ΔP in the embodiment, it is not so limited. The correction may be performed for a specific frequency range.

The signal processor of the embodiment can be applied to any devices such as, for example, cell-phones, mobile or stand-alone music players, notebook personal computers, and tablet terminals.

Moreover, the various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A signal processor comprising:
a band divider configured to calculate an amplitude indicating sound pressure from an acoustic signal for each frequency range of a plurality of frequency ranges;
a first correction module configured to correct the amplitude for each frequency range to change a dynamic range of the amplitude for each frequency range to a target dynamic range;
a determiner configured to determine whether a maximum amplitude of the amplitudes corrected by the first corrector is equal to or larger than a threshold;
an adjuster configured to adjust a first coefficient and a second coefficient if the determiner determines that the maximum amplitude is equal to or larger than the threshold, the adjuster configured to adjust the first coefficient and the second coefficient based on a first condition and a second condition, a sum of a first value and a second value being lower than the threshold in the first condition, the first value obtained by multiplying the first coefficient by the amplitude of the maximum amplitude before being corrected, the second value obtained by multiplying the second coefficient by a correction amount by which the amplitude is corrected to the maximum amplitude, and the second condition specifying a condition that the first coefficient and the second coefficient maintain a change amount of the dynamic range, wherein
the adjuster is configured to set the first coefficient to one, and to select the second coefficient satisfying the second condition under the condition that the first coefficient is set to one; and
a second correction module configured to add a third value obtained by multiplying the first coefficient by the acoustic signal to a fourth value obtained by multiplying the second coefficient by the correction amount, and to output a resulting value as an output signal, wherein
at least one of the band divider, the first correction module, the determiner, the adjuster, and the second correction module is implemented by at least one hardware processor.

2. The signal processor of claim 1, wherein the adjuster is configured to select a maximum value of the second coefficient satisfying the second condition.

3. The signal processor of claim 1, wherein the adjuster is configured to adjust the first coefficient and the second coefficient according to an output condition.

4. The signal processor of claim 1, wherein the second corrector is configured to smoothen the output signal in a temporal direction before outputting the signal.

5. A signal processing method comprising:
calculating, by at least one hardware processor, an amplitude indicating sound pressure from an acoustic signal for each frequency range of a plurality of frequency ranges;
correcting, by the at least one hardware processor, the amplitude for each frequency range to change a dynamic range of the amplitude for each frequency range to a target dynamic range;
determining, by the at least one hardware processor, whether a maximum amplitude of the amplitudes corrected at the correcting is equal to or larger than a threshold;
adjusting, by the at least one hardware processor, a first coefficient and a second coefficient if the maximum amplitude is determined to be equal to or larger than the threshold at the determining, the adjusting based on a first condition and a second condition, a sum of a first value and a second value being lower than the threshold in the first condition, the first value obtained by multiplying the first coefficient by the amplitude of the maximum amplitude before being corrected, the second value obtained by multiplying the second coefficient by a correction amount by which the amplitude is corrected to the maximum amplitude, the second condition specifying a condition that the first coefficient and the second coefficient maintain a change amount of the dynamic range, the first coefficient being set to one, the second coefficient being selected to satisfy the second condition under the condition that the first coefficient is set to one; and
adding, by the at least one hardware processor, a third value obtained by multiplying the first coefficient by the acoustic signal to a fourth value obtained by multiplying the second coefficient by the correction amount of the amplitude, and outputting a resulting value as an output signal.

6. A computer program product having a non-transitory computer readable medium including programmed instructions, wherein the instructions, when executed by a computer, cause the computer to perform:

calculating an amplitude indicating sound pressure from an acoustic signal for each frequency range of a plurality of frequency ranges;

correcting the amplitude for each frequency range to change a dynamic range of the amplitude for each frequency range to a target dynamic range;

determining whether a maximum amplitude of the amplitudes corrected at the correcting is equal to or larger than a threshold;

adjusting a first coefficient and a second coefficient if the maximum amplitude is determined to be equal to or larger than the threshold at the determining, the adjusting based on a first condition and a second condition, a sum of a first value and a second value being lower than the threshold in the first condition, the first value obtained by multiplying the first coefficient by the amplitude of the maximum amplitude before being corrected, the second value obtained by multiplying the second coefficient by a correction amount by which the amplitude is corrected to the maximum amplitude, the second condition specifying a condition that the first coefficient and the second coefficient maintain a change amount of the dynamic range, the first coefficient being set to one, the second coefficient being selected to satisfy the second condition under the condition that the first coefficient is set to one; and adding a third value obtained by multiplying the first coefficient by the acoustic signal to a fourth value obtained by multiplying the second coefficient by the correction amount of the amplitude, and outputting a resulting value as an output signal.

* * * * *